(12) United States Patent
He et al.

(10) Patent No.: US 11,217,156 B2
(45) Date of Patent: Jan. 4, 2022

(54) DISPLAY PANEL INCLUDING ORGANIC LIGHT-EMITTING ELEMENTS AND MICRO LEDS, MANUFACTURING METHOD THEREOF AND DISPLAY DEVICE

(71) Applicant: Shanghai Tianma Micro-Electronics Co., Ltd., Shanghai (CN)

(72) Inventors: Zeshang He, Shanghai (CN); Shaorong Yu, Shanghai (CN)

(73) Assignee: Shanghai Tianma Micro-Electronics Co., Ltd., Shanghai (CN)

(*) Notice: Subject to any disclaimer, the term of this patent is extended or adjusted under 35 U.S.C. 154(b) by 10 days.

(21) Appl. No.: 16/734,987

(22) Filed: Jan. 6, 2020

(65) Prior Publication Data
US 2020/0312237 A1    Oct. 1, 2020

(30) Foreign Application Priority Data

Mar. 29, 2019 (CN) .......................... 201910251126.9

(51) Int. Cl.
  *G09G 3/3225* (2016.01)
  *H01L 27/32* (2006.01)
  *H01L 51/52* (2006.01)
(52) U.S. Cl.
  CPC ....... *G09G 3/3225* (2013.01); *H01L 27/3244* (2013.01); *H01L 51/5253* (2013.01)
(58) Field of Classification Search
  CPC ......... G09G 3/3225; G09G 2300/0426; G09G 2300/023; H01L 27/3244; H01L 51/5253; H01L 51/5256; H01L 27/3225; H01L 27/3227; H01L 27/156; H01L 2227/323
  See application file for complete search history.

(56) References Cited

U.S. PATENT DOCUMENTS

| 2017/0179092 A1* | 6/2017 | Sasaki | G09G 3/006 |
| 2019/0013365 A1* | 1/2019 | Lin | H01L 27/3225 |
| 2020/0052033 A1* | 2/2020 | Iguchi | H01L 27/1225 |
| 2020/0288070 A1* | 9/2020 | Siala | H04N 5/33 |

FOREIGN PATENT DOCUMENTS

CN    109300951 A    2/2019

OTHER PUBLICATIONS

Office Action for related Chinese Application No. 201910251126.9; report dated Aug. 14, 2020.

* cited by examiner

*Primary Examiner* — Amr A Awad
*Assistant Examiner* — Maheen I Javed
(74) *Attorney, Agent, or Firm* — von Briesen & Roper, s.c.

(57) ABSTRACT

A display panel includes an array substrate, an organic light-emitting layer, a thin film encapsulation layer, multiple micro LEDs and multiple drive signal lines. The organic light-emitting layer is disposed on a side of the array substrate and includes organic light-emitting elements. The thin film encapsulation layer is disposed on a side of the organic light-emitting layer facing away from the array substrate, covers the organic light-emitting layer, and includes a plurality of thin film encapsulation sub-layers sequentially stacked. The micro LEDs are disposed on a side of at least one of the plurality of thin film encapsulation sub-layers facing away from the organic light-emitting layer. The drive signal lines are electrically connected to the micro LEDs and configured to transmit a drive signal to the micro LEDs, and the drive signal lines are disposed in contact with at least one of the thin film encapsulation sub-layers.

18 Claims, 10 Drawing Sheets

DISPLAY PANEL INCLUDING ORGANIC LIGHT-EMITTING ELEMENTS AND MICRO LEDS, MANUFACTURING METHOD THEREOF AND DISPLAY DEVICE

CROSS-REFERENCES TO RELATED APPLICATIONS

This application claims priority to a Chinese patent application No. 201910251126.9 filed on Mar. 29, 2019, the disclosure of which is incorporated herein by reference in its entirety.

TECHNICAL FIELD

Embodiments of the present disclosure relate to the field of display technologies and, in particular, to a display panel, a manufacturing method thereof and a display device.

BACKGROUND

With the continuous development of display technologies, an organic light-emitting element and a micro light emitting diode (LED) may be disposed in the display panel. For example, in order to dispose an optical electronic element such as a front-facing camera in the current full-screen smart phones, a hollowed region needs to be provided in the middle of an upper end of a display screen of the phone and the optical electronic element is disposed in the hollowed region, resulting in a reduced area of a display region of the display panel. A size of the micro LED is much smaller than a size of the organic light-emitting element, and thus the micro LED is used in a region where the optical electronic element is disposed of the display panel to achieve a high-transparency display.

To dispose the organic light-emitting element and the micro LED in the display panel, generally the micro LED is directly hung outside on the display panel, that is, drive lines of the micro LED need to be manufactured on an additional substrate, then the micro LED is transferred to the additional substrate, and then the additional substrate is bonded to an original organic light-emitting diode (OLED) display screen, which increases the thickness of the display panel and is not conducive to the thinning of the display panel.

SUMMARY

In view of this, the present disclosure provides a display panel, a manufacturing method thereof and a display device, which enable both organic light-emitting elements and micro LEDs to be disposed in the display panel and are conducive to reducing a thickness of the display panel and thinning the display panel.

In a first aspect, an embodiment of the present disclosure provides a display panel including an array substrate, an organic light-emitting layer, a thin film encapsulation layer, a plurality of micro LEDs and a plurality of drive signal lines.

The organic light-emitting layer is disposed on a side of the array substrate and includes a plurality of organic light-emitting elements.

The thin film encapsulation layer is disposed on a side of the organic light-emitting layer facing away from the array substrate, covers the organic light-emitting layer, and includes a plurality of thin film encapsulation sub-layers which are sequentially stacked.

The plurality of micro LEDs is disposed on a side of at least one of the plurality of thin film encapsulation sub-layers facing away from the organic light-emitting layer.

Each of the plurality of drive signal lines is electrically connected to corresponding micro LEDs of the plurality of micro LEDs and configured to transmit a drive signal to the corresponding micro LEDs of the plurality of micro LEDs. The plurality of drive signal lines is disposed in contact with at least one of the plurality of thin film encapsulation sub-layers.

In a second aspect, an embodiment of the present disclosure further provides a manufacturing method of a display panel. The manufacturing method is used for manufacturing the display panel described in the first aspect and includes steps described below.

An array substrate is provided.

An organic light-emitting layer is formed on the array substrate, where the organic light-emitting layer includes a plurality of organic light-emitting elements.

A thin film encapsulation layer is formed on the organic light-emitting layer, where the thin film encapsulation layer covers the organic light-emitting layer and includes a plurality of thin film encapsulation sub-layers which are sequentially stacked.

The step of forming the thin film encapsulation layer on the organic light-emitting layer further includes a step described below.

A plurality of micro LEDs is provided and disposed on at least one of the plurality of thin film encapsulation sub-layers.

The step of forming the thin film encapsulation layer on the organic light-emitting layer further includes a step described below.

A plurality of drive signal lines is formed on at least one of the plurality of thin film encapsulation sub-layers, where each of the plurality of drive signal lines is electrically connected to corresponding micro LEDs of the plurality of micro LEDs and configured to transmit a drive signal to the corresponding micro LEDs of the plurality of micro LEDs.

In a third aspect, an embodiment of the present disclosure further provides a display device including the display panel described in the first aspect.

Embodiments of the present disclosure provide the display panel, the manufacturing method thereof and the display device. The display panel includes the array substrate, the organic light-emitting layer, the thin film encapsulation layer, the plurality of micro LEDs and the plurality of drive signal lines. The organic light-emitting layer is disposed on the side of the array substrate and includes the plurality of organic light-emitting elements. The thin film encapsulation layer is disposed on the side of the organic light-emitting layer facing away from the array substrate, covers the organic light-emitting layer, and includes the plurality of thin film encapsulation sub-layers which are sequentially stacked. The plurality of micro LEDs is disposed on the side of the at least one of the plurality of thin film encapsulation sub-layers facing away from the organic light-emitting layer. Each of the plurality of drive signal lines is electrically connected to the corresponding micro LEDs of the plurality of micro LEDs and configured to transmit the drive signal to the corresponding micro LEDs of the plurality of micro LEDs, and the plurality of drive signal lines is disposed in contact with the at least one of the plurality of thin film encapsulation sub-layers. In this way, while the organic light-emitting elements and the micro LEDs are disposed in the display panel, the micro LEDs and the drive signal lines are integrated on the thin film encapsulation layer or inside the thin film encapsulation layer. Compared with the related art, the present disclosure reduces a substrate on which the micro LEDs are disposed and improves an integration degree of the display panel, thereby reducing the thickness of the display panel, that is, facilitating the thinning of the display panel.

BRIEF DESCRIPTION OF DRAWINGS

Other features, objects and advantages of the present disclosure will become more apparent after a detailed description of non-restrictive embodiments with reference to the drawings is read.

DETAILED DESCRIPTION

Figure 1:
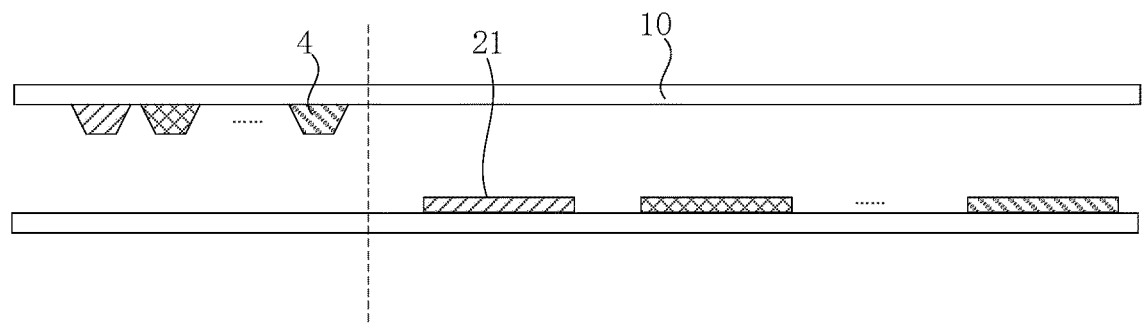
FIG. 1 is a structural diagram of a display panel in the related art.

Hereinafter the present disclosure will be further described in detail in conjunction with the drawings and embodiments. It is to be understood that the specific embodiments set forth below are intended to illustrate and not to limit the present disclosure. Additionally, it is to be noted that, for ease of description, only part, not all, of the structures related to the present disclosure are illustrated in the drawings. Throughout this specification, same or similar numerals denote same or similar structures, elements or processes. It is to be noted that if not in collision, the embodiments and features therein in the present disclosure may be combined with each other.

With the continuous development of display technologies, an organic light-emitting element and a micro light emitting diode (LED) may be disposed in the display panel. For example, in order to dispose an optical electronic element such as a front-facing camera in the current full-screen smart phones, a hollowed region needs to be provided in the middle of an upper end of a display screen of the phone and the optical electronic element is disposed in the hollowed region, resulting in a reduced area of a display region of the display panel. A size of the micro LED is much smaller than a size of the organic light-emitting element, and thus the micro LED is used in a region where the optical electronic element is disposed of the display panel to achieve a high-transparency display. To dispose the organic light-emitting element and the micro LED in the display panel, generally the micro LED is directly hung outside on the display panel, that is, drive lines of the micro LED need to be manufactured on an additional substrate, then the micro LED is transferred to the additional substrate, and then the additional substrate is bonded to an original organic light-emitting diode (OLED) display screen, which increases the thickness of the display panel and is not conducive to the thinning of the display panel.

FIG. 1 is a structural diagram of a display panel in the related art. As shown in FIG. 1, organic light-emitting elements 21 and micros LED 4 are integrated in the display panel, drive lines (not shown in FIG. 0.1) of the micro LEDs 4 need to be manufactured on an additional substrate 10, and the micro LEDs 4 are transferred to the additional substrate 10, and then the additional substrate 10 on which the micro LEDs 4 are manufactured is bonded to the original OLED display screen using an optically clear adhesive (OCA) after the micro LEDs 4 are transferred, which increases the thickness of the display panel and is not conducive to the thinning of the display panel.

A display panel according to an embodiment of the present disclosure includes an array substrate, an organic light-emitting layer, a thin film encapsulation layer, a plurality of micro LEDs and a plurality of drive signal lines. The organic light-emitting layer is disposed on a side of the array substrate and includes a plurality of organic light-emitting elements. The thin film encapsulation layer is disposed on a side of the organic light-emitting layer facing away from the array substrate, covers the organic light-emitting layer, and includes a plurality of thin film encapsulation sub-layers which are sequentially stacked. The plurality of micro LEDs is disposed on a side of at least one of the plurality of thin film encapsulation sub-layers facing away from the organic light-emitting layer. Each of the plurality of drive signal lines is electrically connected to corresponding micro LEDs of the plurality of micro LEDs and configured to transmit a drive signal to the corresponding micro LEDs of the plurality of micro LEDs, and the plurality of drive signal lines is disposed in contact with at least one of the plurality of thin film encapsulation sub-layers. In this way, while the organic light-emitting elements and the micro LEDs are disposed in the display panel, the micro LEDs and the corresponding drive signal lines are integrated on the thin film encapsulation layer or inside the thin film encapsulation layer. Compared with the related art, a substrate on which the micro LEDs are disposed is avoided and an integration degree of the display panel is improved, thereby reducing the thickness of the display panel, that is, facilitating the thinning of the display panel.

The above is the core idea of the present disclosure, technical solutions in the embodiments of the present disclosure will be described clearly and completely in conjunction with drawings in the embodiments of the present disclosure. Based on the embodiments of the present disclosure, all other embodiments obtained by those skilled in the art without creative work are within the scope of the present disclosure.

Figure 2:
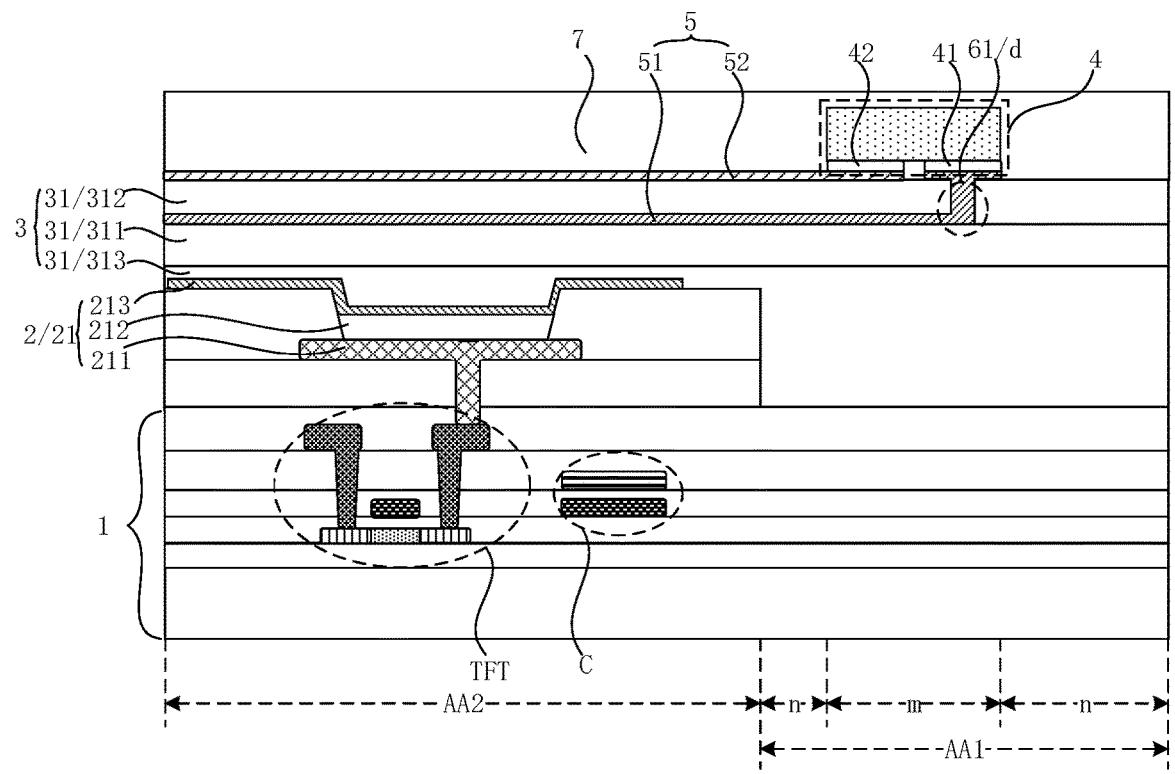
FIG. 2 is a sectional view of a display panel according to an embodiment of the present disclosure.

FIG. 2 is a sectional view of a display panel according to an embodiment of the present disclosure. As shown in FIG. 2, the display panel includes the array substrate 1, the organic light-emitting layer 2, the thin film encapsulation layer 3, the plurality of micro LEDs 4 and the plurality of drive signal lines 5. The organic light-emitting layer 2 is disposed on the side of the array substrate 1 and includes the plurality of organic light-emitting elements 21. The thin film encapsulation layer 3 is disposed on the side of the organic light-emitting layer 2 facing away from the array substrate 1, covers the organic light-emitting layer 2, and includes the plurality of thin film encapsulation sub-layers 31 which are sequentially stacked. The plurality of micro LEDs 4 is disposed on the side of the at least one of the plurality of thin film encapsulation sub-layers 31 facing away from the organic light-emitting layer 2. Each of the plurality of drive signal lines 5 is electrically connected to the corresponding micro LEDs of the plurality of micro LEDs 4 and configured to transmit the drive signal to the corresponding micro LEDs of the plurality of micro LEDs 4, and the plurality of driving signal lines 5 is disposed in contact with the at least one of the plurality of thin film encapsulation sub-layers 31.

Optionally, the plurality of micro LEDs 4 is disposed on the side of the at least one of the plurality of thin film encapsulation sub-layers 31 facing away from the organic light-emitting layer 2, the plurality of drive signal lines 5 configured to transmit the drive signal to the plurality of micro LEDs 4 is disposed in contact with the at least one of the plurality of thin film encapsulation sub-layers 31, so that the organic light-emitting elements 21 and the micro LEDs 4 are disposed in the display panel, meanwhile, the micro LEDs 4 and the corresponding drive signal lines 5 are integrated on the thin film encapsulation layer 3 or inside the thin film encapsulation layer 3, and the thin film encapsulation sub-layer 31 in the thin film encapsulation layer 3 is reused as a substrate on which the drive signal lines 5 are disposed. In addition, the micro LEDs 4 may be transferred to the thin film encapsulation layer 3 and be electrically connected to the drive signal lines 5. Compared with the related art, the substrate on which the micro LEDs are disposed is avoided, and the integration degree of the display panel is improved, thereby reducing the thickness of the display panel, that is, facilitating the thinning of the display panel.

Figure 3:
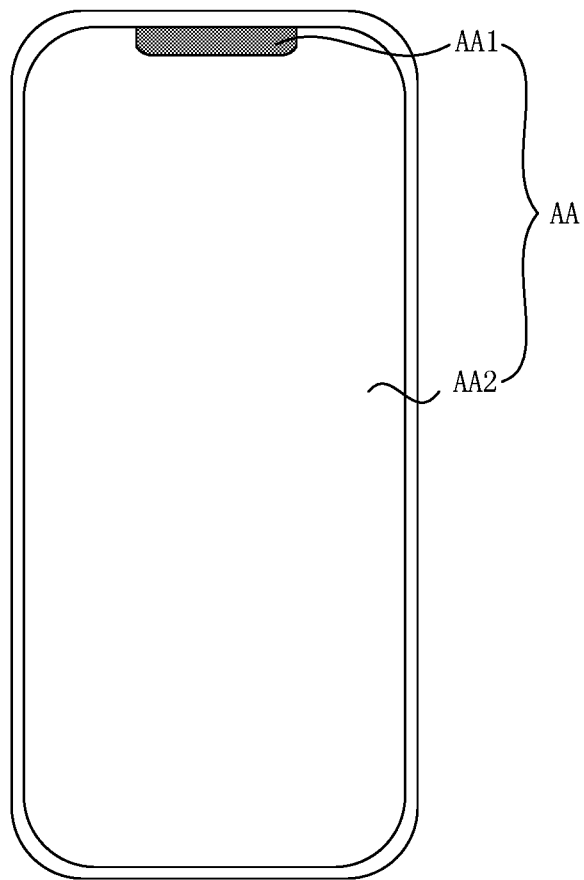
FIG. 3 is a top view of a display panel according to an embodiment of the present disclosure.

FIG. 3 is a top view of a display panel according to an embodiment of the present disclosure. In conjunction with FIGS. 2 and 3, the display panel may include a display region AA, where the display region AA includes a first display region AA1 and a second display region AA2, where the first display region AA1 is reused as a sensor reservation region and includes a light-emitting region m and a light-transmitting region n, where the plurality of micro LEDs 4 is disposed in the light-emitting region m, and the plurality of organic light-emitting elements 21 is disposed in the second display region AA2.

Optionally, in conjunction with FIGS. 2 and 3, the first display region AA1 is reused as the sensor reservation region, that is, the optical electronic element may be disposed in the first display region AA1. For example, in the first display region AA1, at least one optical electronic element, which may be a photosensitive element such as the front-facing camera, an optical sensor and a fingerprint recognition chip, is disposed on a side of the array substrate 1 facing away from the organic light-emitting layer 2, and the micro LEDs 4 are disposed in the light-emitting region m of the first display region AA1. In this way, a display function of the first display region AA1 is implemented; meanwhile, since the size of the micro LED is much smaller than the size of a traditional organic light-emitting element, compared with the organic light-emitting element, the micro LED can enable the light-transmitting region n with a high transmittance and a larger area to be reserved in the first display region AA1, and the optical electronic element can collect a light signal through the light-transmitting region n of the first display region AA1, which can integrate the optical electronic element without providing the hollowed region in the display panel, avoid the problem of the reduced display area of the display panel due to the hollowed region, and improve a screen ratio (a ratio of an area of the display region of the display panel to an area of the whole display panel) of the display panel.

In conjunction with FIGS. 2 and 3, the plurality of organic light-emitting elements 21 is disposed in the second display region AA2, and the second display region AA2 is provided with scanning signal lines, data signal lines, drive circuits and the like corresponding to the organic light-emitting elements 21, where each drive circuit includes a thin film transistor (TFT) and a capacitor C, and along a direction away from the array substrate 1, each of the organic light-emitting elements 21 includes an anode 211, a light-emitting layer 212 and a cathode 213 in sequence. The organic light-emitting elements 21 in the second display region AA2 implement the display function under the action of the corresponding scanning signal lines, data signal lines and drive circuits. Accordingly, in the embodiment of the present disclosure, structural integrity of the display panel and integrity of an image displayed are ensured, the optical electronic element such as the front-facing camera, the optical sensor and the fingerprint recognition chip is reserved, and the micro LEDs 4 and the corresponding drive signal lines 5 are integrated on the thin film encapsulation layer 3 or inside the thin film encapsulation layer 3, reducing the thickness of the display panel, that is, facilitating the thinning of the display panel.

Optionally, in conjunction with FIGS. 2 and 3, a U-shaped boundary may be provided between the first display region AA1 and the second display region AA2, and the first display region AA1 is partially surrounded by the second display region AA2. Optionally, the first display region AA1 may be a position of a fringe of a notch screen, and corresponding to the first display region AA1, the optical electronic element such as the front-facing camera may be disposed on the side of the array substrate 1 facing away from the organic light-emitting layer 2.

Figure 4:
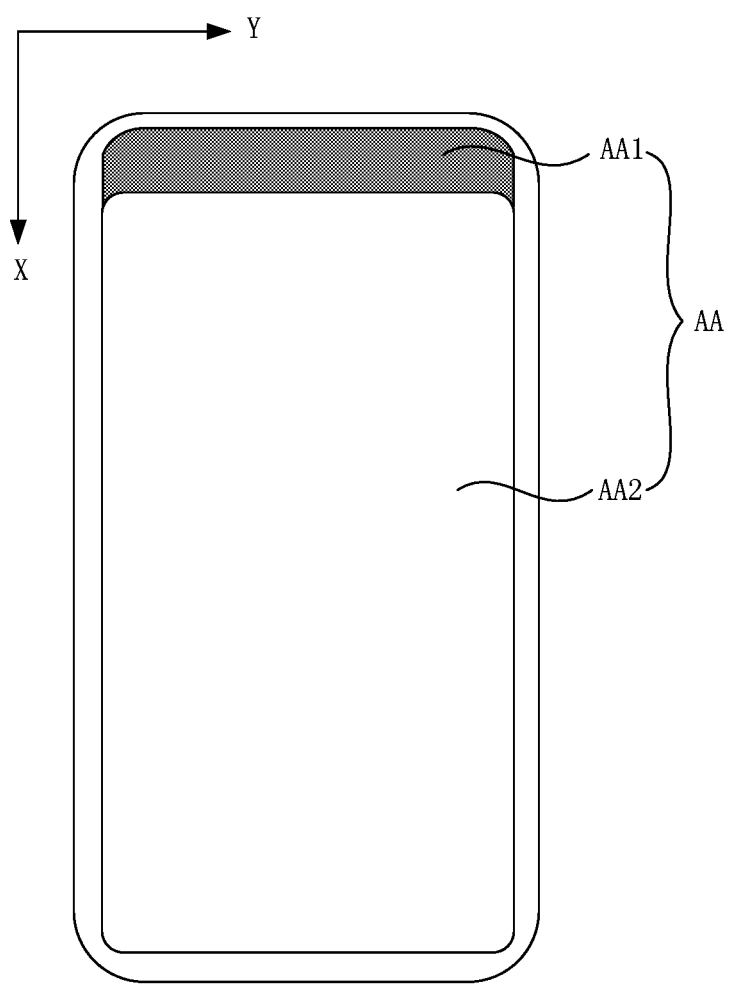
FIG. 4 is a top view of another display panel according to an embodiment of the present disclosure.

FIG. 4 is a top view of another display panel according to an embodiment of the present disclosure. The display panel with a structure shown in FIG. 4 differs from the display panel with a structure shown in FIG. 3 in that the first display region AA1 and the second display region AA2 are arranged along a first direction X, a boundary between the first display region AA1 and the second display region AA2 extends along a second direction Y, where the first direction X intersects the second direction Y. It is to be noted that a specific relationship between the first direction X and the second direction Y is not limited in the embodiment of the present disclosure so long as the first direction X intersects the second direction Y, and FIG. 4 exemplarily shows that the first direction X is perpendicular to the second direction Y.

Exemplarily, for the display panel with the structure shown in FIG. 4, corresponding to the first display region AA1, the optical electronic element such as the front-facing camera may be disposed on the side of the array substrate 1 facing away from the organic light-emitting layer 2. Exemplarily, the first display region AA1 may also be disposed on a side of the second display region AA2 facing towards a bonded chip.

Figure 5:
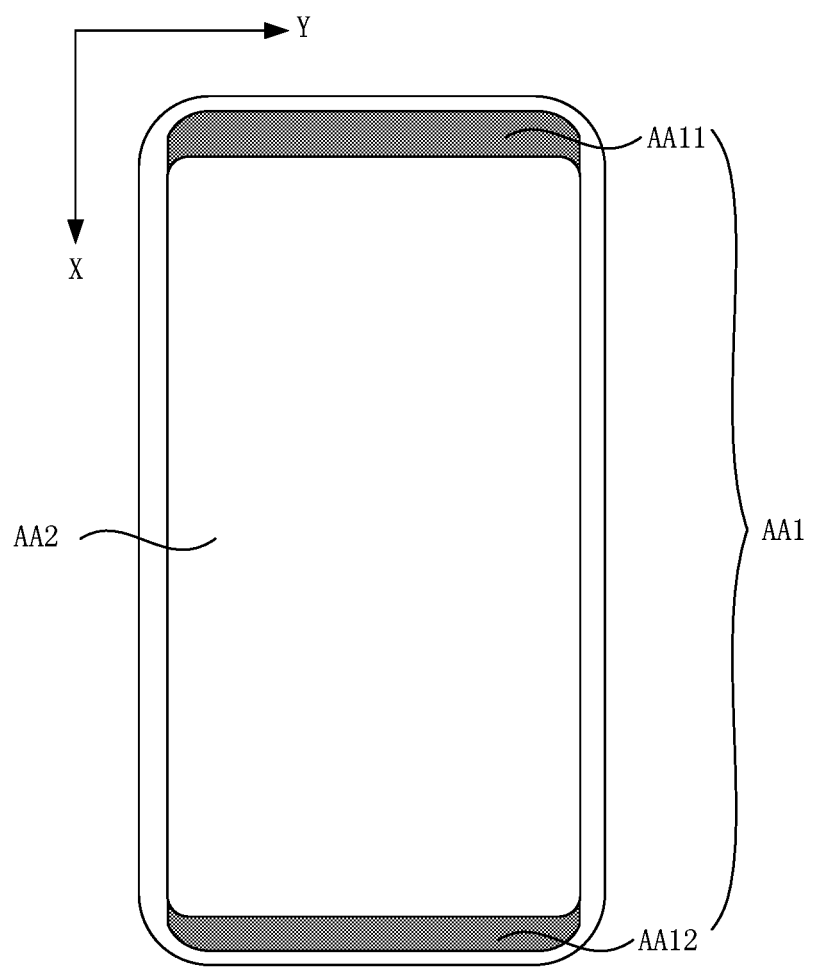
FIG. 5 is a top view of another display panel according to an embodiment of the present disclosure.

FIG. 5 is a top view of another display panel according to an embodiment of the present disclosure. The display panel with a structure shown in FIG. 5 differs from the display panels with the structures shown in FIGS. 3 and 4 in that the first display region AA1 includes a first display sub-region AA11 and a second display sub-region AA12, where the first display sub-region AA11, the second display region AA2 and the second display sub-region AA12 are arranged in sequence along the first direction X. Exemplarily, corresponding to the first display sub-region AA11, the optical electronic element such as the front-facing camera may be disposed on the side of the array substrate 1 facing away from the organic light-emitting layer 2, and corresponding to the second display sub-region, the optical electronic component such as the fingerprint recognition chip may be disposed on the side of the array substrate 1 facing away from the organic light-emitting layer 2.

It is to be noted that the display panel according to the embodiment of the present disclosure includes the display region, and whether the display panel includes another region is not limited in the embodiment of the present disclosure, the display panel without another region may be provided, or the display panel which further includes a frame region surrounding the display region may also be provided, where the frame region may be provided with the corresponding display signal lines and drive chips.

Figure 6:
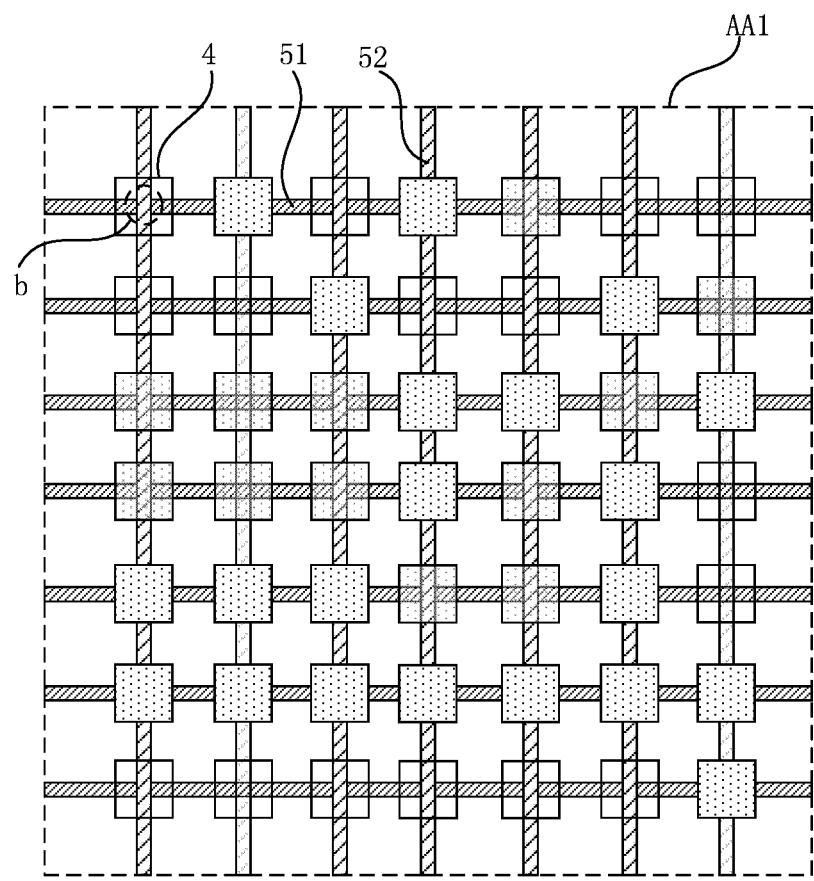
FIG. 6 is a top view of a first display region of a display panel according to an embodiment of the present disclosure.

FIG. 6 is a top view of a first display region of a display panel according to an embodiment of the present disclosure. In conjunction with FIGS. 2 and 6, each of the plurality of drive signal lines 5 includes a first drive signal line 51 and a second drive signal line 52, each micro LED 4 includes a first electrode 41 and a second electrode 42, where the first drive signal line 51 is electrically connected to first electrodes 41 of corresponding micro LEDs 4, and the second drive signal line 52 is electrically connected to second electrode 42 of corresponding micro LEDs 4. The plurality of micro LEDs 4 is arranged in a matrix, first electrodes 41 of micro LEDs 4 in a same row are electrically connected to a same first drive signal line 51, and second electrodes 42 of micro LEDs 4 in a same column are electrically connected to a same second drive signal line 52, where the first drive signal line 51 intersects the second drive signal line 52.

In conjunction with FIGS. 2 and 6, exemplarily, the first electrode 41 may be configured as an anode of the micro LED 4, and the second electrode 42 may be configured as a cathode of the micro LED 4; or the first electrode 41 may be configured as the cathode of the micro LED 4, and the second electrode 42 may be configured as the anode of the micro LED 4. The first electrode 41 of the micro LED 4 is electrically connected to the corresponding first drive signal line 51, the second electrode 42 of the micro LED 4 is electrically connected to the corresponding second drive signal line 52, and a certain voltage difference exists between a signal transmitted through the first drive signal line 51 and a signal transmitted through the second drive signal line 52, and the first drive signal line 51 and the second drive signal line 52 provide a light-emitting voltage signal for the corresponding micro LEDs 4. The plurality of micro LEDs 4 is arranged in the matrix, the first electrodes 41 of the micro LEDs 4 in the same row are electrically connected to the same first drive signal line 51, and the second electrodes 42 of the micro LEDs 4 in the same column are electrically connected to the same second drive signal line 52, where the first drive signal line 51 intersects the second drive signal lines 52, so that the number of first drive signal lines 51 and the number of second drive signal lines 52 are small, reducing a structure which may block light in the first display region AA1, increasing a light-transmitting area, facilitating the wiring of the drive signal lines 5 in the first display region AA1 of the display panel, and reducing the number of drive signals provided by the drive chip and a manufacturing difficulty of the chip.

Optionally, in conjunction with FIGS. 2 and 6, the plurality of thin film encapsulation sub-layers 31 may include a first thin film encapsulation sub-layer 311 and a second thin film encapsulation sub-layer 312, where the first thin film encapsulation sub-layer 311 is disposed between the organic light-emitting layer 2 and the second thin film encapsulation sub-layer 312. The first drive signal line 51 is disposed in contact with the first thin film encapsulation sub-layer 311, and the first drive signal line 51 is disposed between the first thin film encapsulation sub-layer 311 and the second thin film encapsulation sub-layer 312; the second drive signal line 52 is disposed in contact with the second thin film encapsulation sub-layer 312, and the second drive signal line 52 is disposed on a side of the second thin film encapsulation sub-layer 312 facing away from the first thin film encapsulation sub-layer 311; and the second thin film encapsulation sub-layer 312 is provided with a plurality of through holes 61, where the first drive signal line 51 penetrates through corresponding through holes of the plurality of through holes 61 and is electrically connected to the first electrodes 41 of the corresponding micro LEDs 4.

Exemplarily, in conjunction with FIGS. 2 and 6, the micro LED 4 further includes an LED semiconductor structure, where the LED semiconductor structure may include a first-type semiconductor layer, an active layer and a second-type semiconductor layer which are sequentially stacked from top to bottom, and a specific material and a specific structure of the micro LED 4 are not limited in this embodiment, that is, materials of the first-type semiconductor layer, the active layer and the second-type semiconductor layer are not limited, and different materials may be selected according to different light-emitting colors of the micro LEDs 4.

Exemplarily, the micro LED 4 may be a micro LED with electrodes on a same side, that is, the first electrode 41 and the second electrode 42 are disposed on a same side of the LED semiconductor structure. It is to be noted that, in a manufacturing process of the first electrode 41 and the second electrode 42, the first electrode 41 is disposed on a surface of the first-type semiconductor layer facing away from the active layer, the first-type semiconductor layer and the active layer are etched to expose part of the second-type semiconductor layer, and the second electrode 42 is manufactured on a surface of the second-type semiconductor layer facing towards the active layer, to form the micro LED with electrodes on the same side electrode. In this way, after the first drive signal line 51 and the second drive signal line 52 are formed, the micro LEDs 4 are transferred to the corresponding positions, the second electrode 42 of the micro LED 4 is electrically connected to the second drive signal line 52, the first electrode 41 of the micro LED 4 is electrically connected to the first drive signal line 51 through the corresponding through hole 61, and the first drive signal line 51 and the second drive signal line 52 provide the light-emitting voltage signal for the micro LED 4.

The first drive signal lines 51 and the second drive signal lines 52 are disposed in different layers, and at least one thin film encapsulation sub-layer 31 is disposed between the first drive signal lines 51 and the second drive signal lines 52. In this way, while the first thin film encapsulation sub-layer 311 is reused as a substrate of the first drive signal lines 51 and the second thin film encapsulation sub-layer 312 is reused as a substrate of the second drive signal lines 52, at least one thin film encapsulation sub-layer 31 may be reused as an insulating layer between the first drive signal lines 51 and the second drive signal lines 52, simplifying a film arrangement of the display panel.

Figure 7:
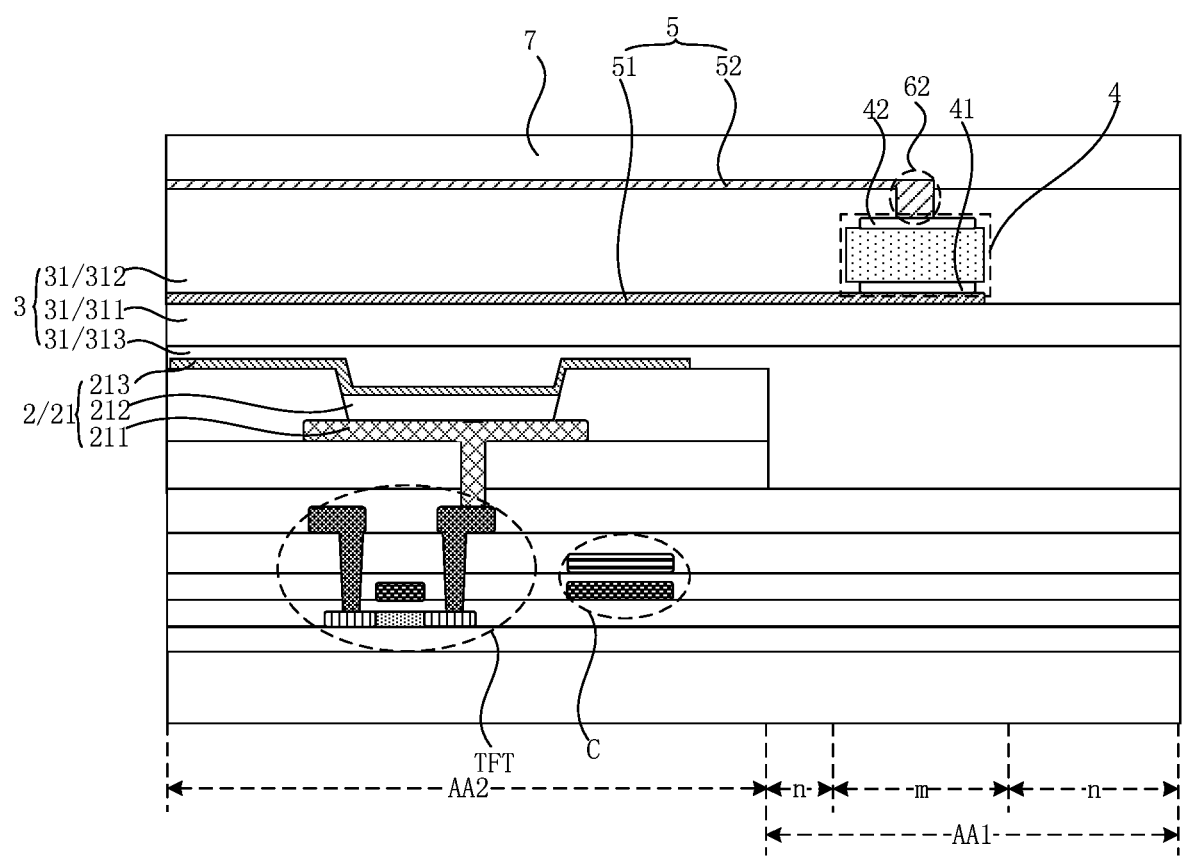
FIG. 7 is a sectional view of another display panel according to an embodiment of the present disclosure.

FIG. 7 is a sectional view of another display panel according to an embodiment of the present disclosure. The display panel with a structure shown in FIG. 7 differs from the display panel with the structure shown in FIG. 2 in that the first electrode 41 and the second electrode 42 of the micro LED 4 are disposed on each side of the LED semiconductor structure, that is, the micro LED 4 is a micro LED with a vertical electrode structure. The micro LEDs 4 may be transferred to the corresponding positions after the first drive signal lines 51 are formed, the first electrode 41 of the micro LED 4 is electrically connected to the first drive signal line 51 directly, the second thin film encapsulation sub-layer 312 is formed and covers the micro LEDs 4, and the second drive signal lines 52 are formed; as shown in FIG. 7, the second drive signal line 52 is electrically connected to the second electrode 42 of the micro LED 4 through a corresponding through hole 62, or the second drive signal line 52 is electrically connected to the second electrode 42 of the micro LED 4 directly, which depend on a size relationship between a height of the micro LED 4 and a thickness of the second thin film encapsulation sub-layer 312, and are not limited in the embodiment of the present disclosure.

Figure 8:
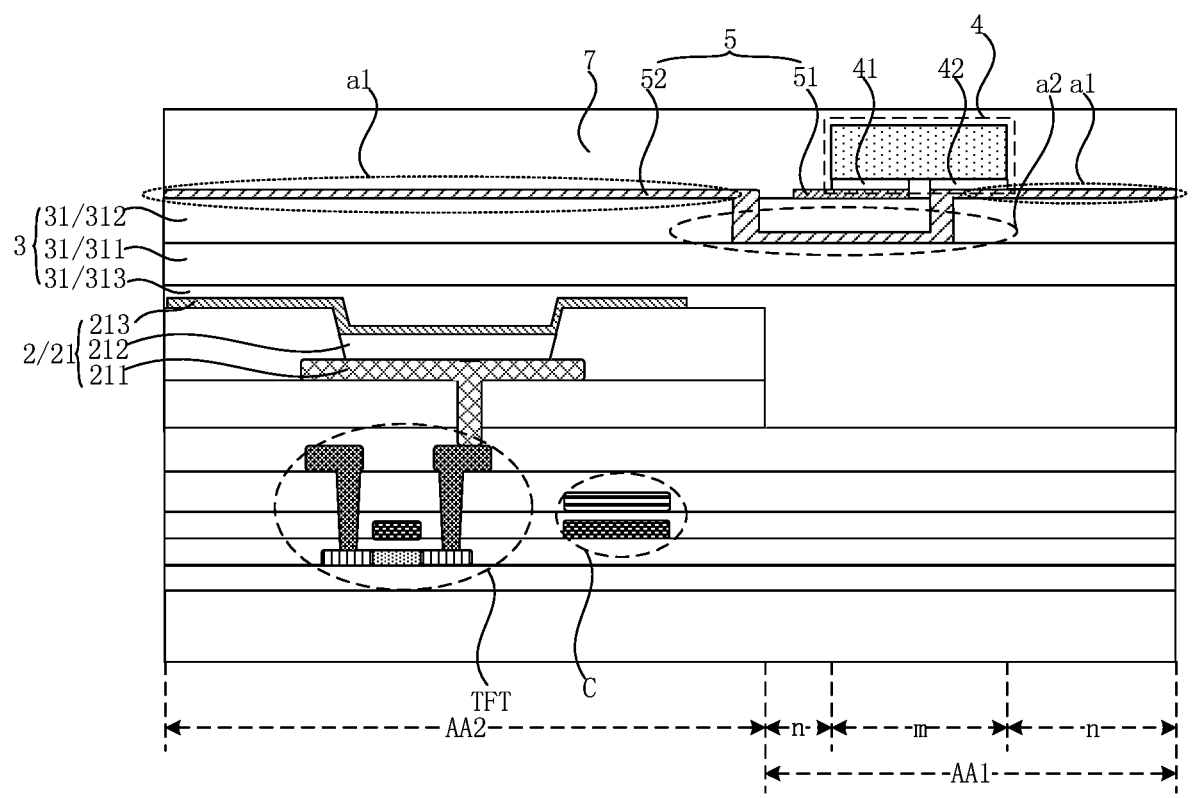
FIG. 8 is a sectional view of another display panel according to an embodiment of the present disclosure.

FIG. 8 is a sectional view of another display panel according to an embodiment of the present disclosure. The display panel with a structure shown in FIG. 8 differs from the display panels with the structures shown in FIGS. 2 and 7 in that the first drive signal line 51 is disposed in contact with the second thin film encapsulation sub-layer 312 and on a side of the second thin film encapsulation sub-layer 312 facing away from the first thin film encapsulation sub-layer 311, and the second drive signal line 52 includes a plurality of connecting portions a1 and a plurality of bridge portions a2. In conjunction with FIGS. 6 and 8, each of the plurality of bridge portions a2 is disposed at an intersection b of the first drive signal line 51 and the second drive signal line 52 and is configured to electrically connect two adjacent connecting portions a1, and the connecting portions a1 and the first drive signal line 51 are arranged in a same layer, and the plurality of bridge portions a2 is disposed in contact with the first thin film encapsulation sub-layer 311 and disposed between the first thin film encapsulation sub-layer 311 and the second thin film encapsulation sub-layer 312.

Optionally, in conjunction with FIGS. 6 and 8, the first drive signal line 51 intersects the second drive signal line 52, the first drive signal line 51 and the connecting portions a1 of the second drive signal line 52 may be arranged in the same layer, and at the intersection b of the first drive signal line 51 and the second drive signal line 52, the bridge portion a2 between the first thin film encapsulation sub-layer 311 and the second thin film encapsulation sub-layer 312 of the second drive signal line 52 electrically connect the connecting portions a1 of the second drive signal line 52 which are arranged in the same layer as the first drive signal line 51, to ensure that the first drive signal line 51 is electrically insulated from the second drive signal line 52.

Exemplarily, the bridge portion a2 may be made of a transparent conductive material, for example, a structure of the bridge portion a2 may include indium tin oxides (ITO). Optionally, in conjunction with FIGS. 3 to 5 and FIG. 8, the optical electronic element such as the front-facing camera, the optical sensor and the fingerprint recognition chip may be disposed in the first display region AA1, and the bridge portion a2 may be made of a transparent material, which is conducive to improving a light collection amount of the optical electronic element.

In addition, another display panel differs from the display panels with the structures shown in FIG. 2 and FIGS. 6 to 8 in that in the first display region AA1, the first drive signal line 51 does not intersect the second drive signal line 52, and the first drive signal line 51 and the second drive signal line 52 which are electrically connected to each micro LED 4 are directly connected to the corresponding ports of the drive chips in the display panel; therefore, the first drive signal line 51 and the second drive signal line 52 may be arranged in a same layer, that is, the plurality of drive signal lines 5 in the display panel may be disposed in contact with merely one of the plurality of thin film encapsulation sub-layers 31.

It is to be noted that the row and the column in the embodiments described above are relative concepts, which may be specifically determined according to whether the display panel performs a landscape display or a portrait display, and therefore, the first drive signal line 51 and the second drive signal line 52 are also relative concepts.

Optionally, in conjunction with FIGS. 2, 7 and 8, at least one of the first thin film encapsulation sub-layer 311 or the second thin film encapsulation sub-layer 312 may be an organic film, for example, the first thin film encapsulation sub-layer 311 may be the organic film and the second thin film encapsulation sub-layer 312 may be an inorganic film, or the first thin film encapsulation sub-layer 311 is the inorganic film and the second thin film encapsulation sub-layer 312 is the organic film, or the first thin film encapsulation sub-layer 311 and the second thin film encapsulation sub-layer 312 both are the organic films. The organic film has a better stress relief property. When a concentrated stress of the inorganic film in the thin film encapsulation layer 3 is relieved, a stress acted on the first drive signal line 51 or the second drive signal line 52 in contact with the organic film in the thin film encapsulation layer 3 may be relieved at the same time, reducing a disconnection probability of the first drive signal line 51 and the second drive signal line 52. In addition, the organic film further has a better planarization property, which is conducive to improving a planarization degree of a structure above the organic film in the thin film encapsulation layer 3.

Optionally, in conjunction with FIGS. 2, 7 and 8, the plurality of thin film encapsulation sub-layers 31 may further include a third thin film encapsulation sub-layer 313, where the third thin film encapsulation sub-layer 313 is disposed in contact with the organic light-emitting layer 2 and disposed between the organic light-emitting layer 2 and the first thin film encapsulation sub-layer 311, and the third thin film encapsulation sub-layer 313 may be the inorganic film. Specifically, a light-emitting property of the organic light-emitting element 21 is affected due to contact between water and oxygen in an ambient environment and the light-emitting layer 212 of the organic light-emitting element 21, and therefore the third thin film encapsulation sub-layer 313, in contact with the organic light-emitting layer 2, in the thin film encapsulation layer 3 is configured as the inorganic film, which is conducive to improving a protective effect of the thin film encapsulation layer 3 on the organic light-emitting element 21, and reducing an impact of water and oxygen in the ambient environment on the light-emitting property of the organic light-emitting element 21.

Figure 9:
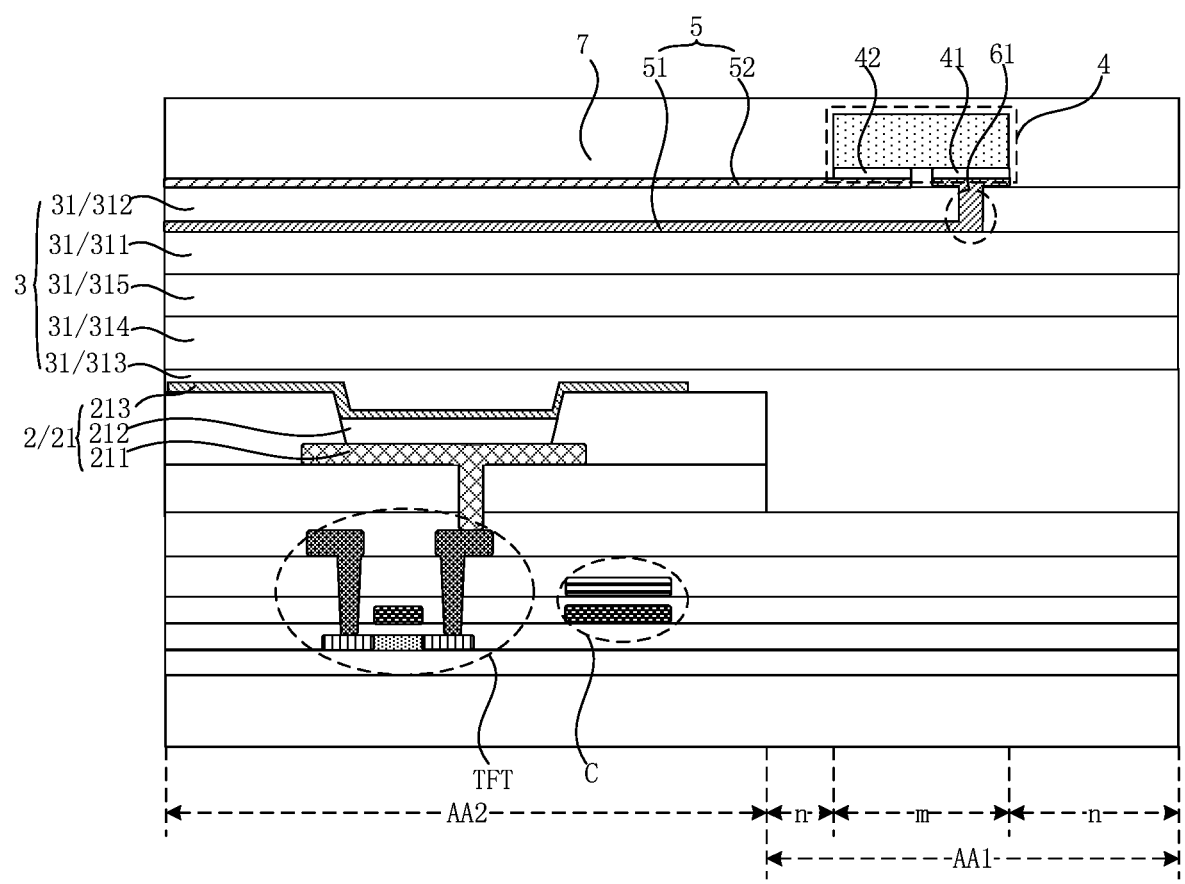
FIG. 9 is a sectional view of another display panel according to an embodiment of the present disclosure.

FIG. 9 is a sectional view of another display panel according to an embodiment of the present disclosure. As shown in FIG. 9, based on the above-mentioned embodiments, in the display panel with a structure shown in FIG. 9, the plurality of thin film encapsulation sub-layers 31 further includes a fourth thin film encapsulation sub-layer 314 and a fifth thin film encapsulation sub-layer 315, where the fourth thin film encapsulation sub-layer 314 is the organic film and the fifth thin film encapsulation sub-layer 315 is the inorganic film. The fourth thin film encapsulation sub-layer 314 is disposed between the third thin film encapsulation sub-layer 313 and the first thin film encapsulation sub-layer 311, and the fifth thin film encapsulation sub-layer 315 is disposed between the fourth thin film encapsulation sub-layer 314 and the first thin film encapsulation sub-layer 311.

Optionally, the first drive signal line 51 and the second drive signal line 52 may be metal traces. A high temperature process is involved in a manufacturing process of the metal traces, and an extremely-high temperature will affect the light-emitting property of the light-emitting layer 212 of the organic light-emitting element 21 and reduce a service life of the organic light-emitting element 21. The plurality of thin film encapsulation sub-layers 31 further includes the fourth thin film encapsulation sub-layer 314 and the fifth thin film encapsulation sub-layer 315, the fourth thin film encapsulation sub-layer 314 is disposed between the third thin film encapsulation sub-layer 313 and the first thin film encapsulation sub-layer 311, and the fifth thin film encapsulation sub-layer 315 is disposed between the fourth thin film encapsulation sub-layer 314 and the first thin film encapsulation sub-layer 311. Therefore, in a direction perpendicular to the display panel, distances of the first drive signal line 51 and the second drive signal line 52 from the light-emitting layer 212 of the organic light-emitting element 21 are increased, and an impact of the high temperature process in the manufacturing process of the metal traces on the service life of the organic light-emitting element 21 is reduced.

In addition, the fourth thin film encapsulation sub-layer 314 is configured as the organic film, the fifth thin film encapsulation sub-layer 315 is configured as the inorganic film, and the third thin film encapsulation sub-layer 313 is configured as the inorganic film; therefore, a stacked structure which includes the inorganic film, the organic film and the inorganic film and is adjacent to the organic light-emitting layer 2 is formed above the organic light-emitting layer 2. The inorganic film is used for effectively reducing the impact of water and oxygen in the ambient environment on the organic light-emitting element 21, and the organic film is used for effectively relieving the concentrated stress acted on the inorganic film, reducing a fracture probability of the inorganic film. Exemplarily, the inorganic film in the thin film encapsulation layer 3 may be made of a material including any one of $SiO_x$, $SiN_x$ or $Al_2O_3$.

It to be noted that a specific number of thin film encapsulation sub-layers 31 in the thin film encapsulation layer 3 is not limited in the embodiment of the present disclosure, and preferably, it is ensured that the inorganic film is in contact with the organic light-emitting layer 2 in the thin film encapsulation layer 3, the inorganic film and the organic film are alternated in the thin film encapsulation layer 3, and the number of thin film encapsulation sub-layers 31 in the thin film encapsulation layer 3 is greater than or equal to 4.

Optionally, in conjunction with FIG. 2 and FIGS. 7 to 9, the display panel may further include a protective layer 7, where the protective layer 7 is disposed on a side of the plurality of micro LEDs 4 facing away from the organic light-emitting layer 2 and covers the plurality of micro LEDs 4 and the thin film encapsulation layer 3. The protective layer 7 is used for protecting the micro LEDs 4 and improving a planarization degree of a surface of the display panel. Exemplarity, the protective layer 7 may be made of a material including glass or polyimide.

It to be noted that the drawings of the embodiments of the present disclosure merely and exemplarily illustrate a size of each element and each film, and do not indicate practical sizes of each element and each film in the display panel.

Figure 10:
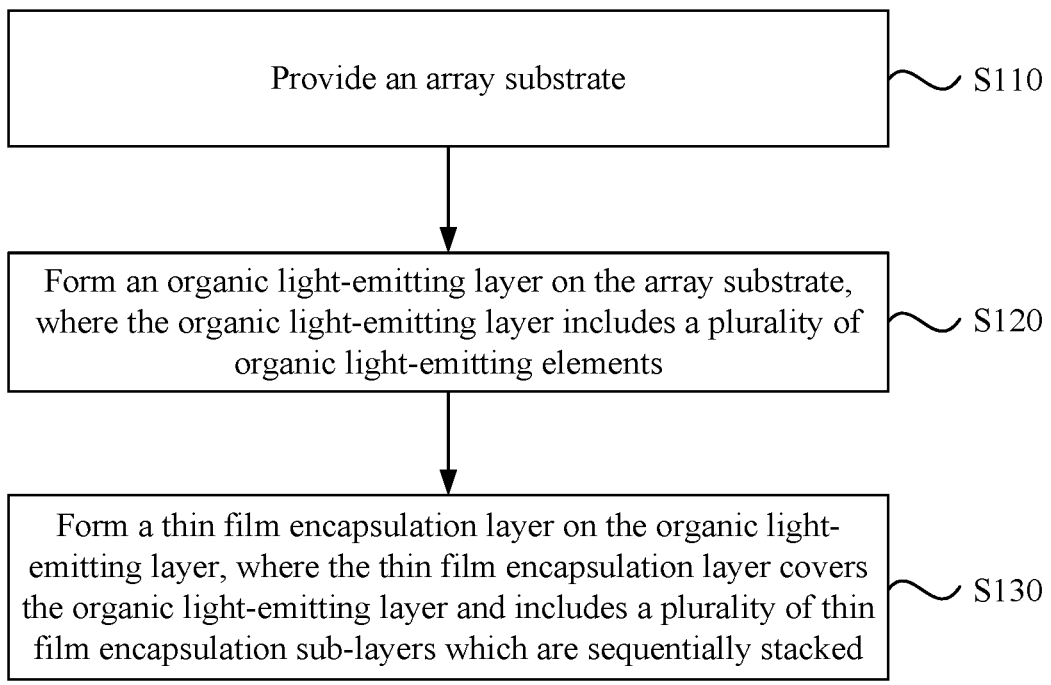
FIG. 10 is a flowchart illustrating a manufacturing method of a display panel according to an embodiment of the present disclosure.

An embodiment of the present disclosure further provides a manufacturing method of a display panel, where the manufacturing method is used for manufacturing the display panel in the above-mentioned embodiments. FIG. 10 is a flowchart illustrating a manufacturing method of a display panel according to an embodiment of the present disclosure. As shown in FIG. 10, the manufacturing method of the display panel includes steps described below.

In S110, an array substrate is provided.

Optionally, in conjunction with FIG. 2 and FIGS. 7 to 9, the array substrate 1 is provided, a drive circuit of an organic light-emitting element 21 is disposed in the array substrate 1, and the drive circuit includes a thin film transistor (TFT) and a capacitor C.

In S120, an organic light-emitting layer is formed on the array substrate, where the organic light-emitting layer includes a plurality of organic light-emitting elements.

Optionally, in conjunction with FIG. 2 and FIGS. 7 to 9, the organic light-emitting layer 2 is formed on the array substrate 1, where the organic light-emitting layer 2 includes the plurality of organic light-emitting elements 21, and in a direction away from the array substrate 1, each organic light-emitting element 21 includes an anode 211, a light-emitting layer 212 and a cathode 213 in sequence.

In S130, a thin film encapsulation layer is formed on the organic light-emitting layer, where the thin film encapsulation layer covers the organic light-emitting layer and includes a plurality of thin film encapsulation sub-layers which are sequentially stacked.

Optionally, in conjunction with FIG. 2 and FIGS. 7 to 9, the thin film encapsulation layer 3 is formed on the organic light-emitting layer 2, where the thin film encapsulation layer 3 covers the organic light-emitting layer 2 and includes the plurality of thin film encapsulation sub-layers 31 which are sequentially stacked.

Optionally, in conjunction with FIG. 2 and FIGS. 7 to 9, the step of forming the thin film encapsulation layer 3 on the organic light-emitting layer 2 further includes providing a plurality of micro LEDs 4, and disposing the plurality of micro LEDs 4 on at least one of the plurality of thin film encapsulation sub-layers 31. The step of forming the thin film encapsulation layer 3 on the organic light-emitting layer 2 further includes forming a plurality of drive signal lines 5 on at least one of the plurality of thin film encapsulation sub-layers 31, where each of the plurality of drive signal lines 5 is electrically connected to corresponding micro LEDs 4 of the plurality of micro LEDs 4 and configured to transmit a drive signal to the corresponding micro LEDs 4 of the plurality of micro LEDs 4.

Optionally, in conjunction with FIG. 2 and FIGS. 8 to 10, the plurality of micro LEDs 4 may be electrically connected to the plurality of drive signal lines 5 in a bonding manner. In conjunction with FIGS. 2, 9 and 10, the corresponding micro LEDs 4 may be bound to corresponding positions to be electrically connected to the corresponding drive signal line 5 after a first drive signal line 51 and a second drive signal line 52 are formed. As shown in FIG. 8, the first drive signal line 51 may be formed, the corresponding micro LEDs 4 may be bound to the corresponding positions to enable first electrodes 41 of the corresponding micro LEDs 4 to be electrically connected to the first drive signal line 51, and the second drive signal line 52 is formed, where the second drive signal line 52 is electrically connected to second electrodes 42 of the corresponding micro LEDs 4.

Optionally, as shown in FIG. 2, the plurality of thin film encapsulation sub-layers 31 includes a first thin film encapsulation sub-layer 311 and a second thin film encapsulation sub-layer 312, each of the plurality of drive signal lines 5 includes the first drive signal line 51 and the second drive signal line 52, each micro LED 4 includes the first electrode 41 and the second electrode 42, the first drive signal line 51 is electrically connected to the first electrodes 41 of the corresponding micro LEDs 4, and the second drive signal line 52 is electrically connected to the second electrodes 42 of the corresponding micro LEDs 4. The step of forming the plurality of drive signal lines 5 on the at least one of the plurality of thin film encapsulation sub-layers 31 includes forming the first thin film encapsulation sub-layer 311 on the organic light-emitting layer 2, forming the first drive signal line 51 on the first thin film encapsulation sub-layer 311, and forming the second thin film encapsulation sub-layer 312, where the second thin film encapsulation sub-layer 312 covers the first thin film encapsulation sub-layer 311 and the first drive signal line 51, etching the second thin film encapsulation sub-layer 312 to form a plurality of through holes 61 on the second thin film encapsulation sub-layer 312, and forming the second drive signal line 52 and a plurality of filling portions d on the second thin film encapsulation sub-layer 312, where each of the filling portions d is filled with a respective one of the plurality of through holes 61 and is in contact with the first drive signal line 51, and the first drive signal line 51 is electrically connected to the first electrodes 41 of the corresponding micro LED 4 through corresponding filling portions d.

Optionally, in conjunction with FIG. 2 and FIGS. 8 to 10, the plurality of thin film encapsulation sub-layers 31 further includes a third thin film encapsulation sub-layer 313, where the third thin film encapsulation sub-layer 313 is an inorganic film. The step of forming the first thin film encapsulation sub-layer 311 on the organic light-emitting layer 2 further includes forming the third thin film encapsulation sub-layer 313 on the organic light-emitting layer 2, where the third thin film encapsulation sub-layer 313 is in contact with the organic light-emitting layer 2, and forming the first thin film encapsulation sub-layer 311 on the third thin film encapsulation sub-layer 313.

Optionally, as shown in FIG. 9, the plurality of thin film encapsulation sub-layers 31 further includes a fourth thin film encapsulation sub-layer 314 and a fifth thin film encapsulation sub-layer 315, where the fourth thin film encapsulation sub-layer 314 is an organic film and the fifth thin film encapsulation sub-layer 315 is the inorganic film. The step of forming the first thin film encapsulation sub-layer 311 on the third thin film encapsulation sub-layer 313 further includes forming the fourth thin film encapsulation sub-layer 314 on the third thin film encapsulation sub-layer 313, forming the fifth thin film encapsulation sub-layer 315 on the fourth thin film encapsulation sub-layer 314, and forming the first thin film encapsulation sub-layer 311 on the fifth thin film encapsulation sub-layer 315.

Optionally, the plurality of thin film encapsulation sub-layers includes at least one inorganic film and at least one organic film, where the at least one inorganic film may be formed in a deposition manner, and the at least one organic film may be formed in an ink-jet printing manner.

Figure 11:
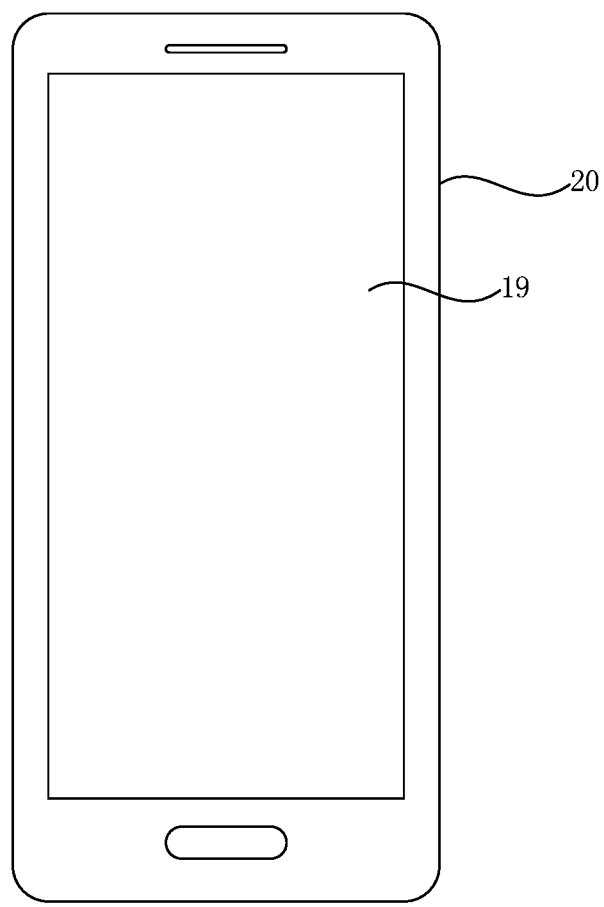
FIG. 11 is a structural diagram of a display device according to an embodiment of the present disclosure.

An embodiment of the present disclosure further provides a display device. FIG. 11 is a structural diagram of a display device according to an embodiment of the present disclosure. As shown in FIG. 11, the display device 20 includes the display panel 19 in the above-mentioned embodiments. Therefore, the display device 20 according to the embodiment of the present disclosure also has the beneficial effects described in the above-mentioned embodiments, and details are not described here again. Exemplarily, the display device 20 may be a mobile phone, a computer, a television or another electronic display device.

It is to be noted that the above are merely optional embodiments of the present disclosure and the technical principles used therein. It will be understood by those skilled in the art that the present disclosure is not limited to the specific embodiments described herein. Those skilled in the art can make various apparent modifications, adaptations and substitutions without departing from the scope of the present disclosure. Therefore, while the present disclosure has been described in detail through the above-mentioned embodiments, the present disclosure is not limited to the above-mentioned embodiments and may include more other equivalent embodiments without departing from the concept of the present disclosure. The scope of the present disclosure is determined by the scope of the appended claims.

What is claimed is:

1. A display panel, comprising:
   an array substrate;
   an organic light-emitting layer, wherein the organic light-emitting layer is disposed on a side of the array substrate and comprises a plurality of organic light-emitting elements;
   a thin film encapsulation layer, wherein the thin film encapsulation layer is disposed on a side of the organic light-emitting layer facing away from the array substrate, covers the organic light-emitting layer, and comprises a plurality of thin film encapsulation sub-layers which are sequentially stacked;
   a plurality of micro light-emitting diodes (LEDs), wherein the plurality of micro LEDs is disposed on a side of at least one of the plurality of thin film encapsulation sub-layers facing away from the organic light-emitting layer; and
   a plurality of drive signal lines, wherein the plurality of drive signal lines is electrically connected to the plurality of micro LEDs and configured to transmit drive signals to the plurality of micro LEDs, and the plurality of drive signal lines is disposed in contact with at least one of the plurality of thin film encapsulation sub-layers;
   wherein the plurality of thin film encapsulation sub-layers comprises a first thin film encapsulation sub-layer and a second thin film encapsulation sub-layer, wherein the first thin film encapsulation sub-layer is disposed between the organic light-emitting layer and the second thin film encapsulation sub-layer.

2. The display panel of claim 1, wherein
   each of the plurality of drive signal lines comprises a first drive signal line and a second drive signal line, each of the plurality of micro LEDs comprises a first electrode and a second electrode, wherein the first drive signal line is electrically connected to first electrodes of corresponding micro LEDs of the plurality of micro LEDs, and the second drive signal line is electrically connected to second electrodes of corresponding micro LEDs of the plurality of micro LEDs; and
   the plurality of micro LEDs is arranged in a matrix, first electrodes of micro LEDs in a same row are electrically connected to a same one of first drive signal lines, and second electrodes of micro LEDs in a same column are electrically connected to a same one of second drive signal lines; wherein the first drive signal line intersects the second drive signal line.

3. The display panel of claim 2, wherein the first drive signal line is disposed in contact with the first thin film encapsulation sub-layer, and the first drive signal line is disposed between the first thin film encapsulation sub-layer and the second thin film encapsulation sub-layer; the second drive signal line is disposed in contact with the second thin film encapsulation sub-layer, and the second drive signal line is disposed on a side of the second thin film encapsulation sub-layer facing away from the first thin film encapsulation sub-layer; and the second thin film encapsulation sub-layer is provided with a plurality of through holes, wherein the first drive signal line penetrates through corresponding through holes of the plurality of through holes and is electrically connected to the first electrodes of the corresponding micro LEDs of the plurality of micro LEDs.

4. The display panel of claim 2, wherein the first drive signal line is disposed in contact with the second thin film encapsulation sub-layer and on a side of the second thin film encapsulation sub-layer facing away from the first thin film encapsulation sub-layer, and the second drive signal line comprises a plurality of connecting portions and a plurality of bridge portions, wherein each of the plurality of bridge portions is disposed at an intersection of the first drive signal line and the second drive signal line and is configured to electrically connect two adjacent connecting portions, and the plurality of connecting portions and the first drive signal line are arranged in a same layer, the plurality of bridge portions is disposed in contact with the first thin film encapsulation sub-layer and disposed between the first thin film encapsulation sub-layer and the second thin film encapsulation sub-layer.

5. The display panel of claim 4, wherein the plurality of bridge portions is made of a transparent conductive material.

6. The display panel of claim 1, wherein at least one of the first thin film encapsulation sub-layer or the second thin film encapsulation sub-layer is an organic film.

7. The display panel of claim 1, wherein the plurality of thin film encapsulation sub-layers further comprises a third thin film encapsulation sub-layer, wherein the third thin film encapsulation sub-layer is disposed in contact with the organic light-emitting layer and disposed between the organic light-emitting layer and the first thin film encapsulation sub-layer, and the third thin film encapsulation sub-layer is an inorganic film.

8. The display panel of claim 7, wherein the plurality of thin film encapsulation sub-layers further comprises a fourth thin film encapsulation sub-layer and a fifth thin film encapsulation sub-layer, wherein the fourth thin film encapsulation sub-layer is an organic film and the fifth thin film encapsulation sub-layer is the inorganic film; and
wherein the fourth thin film encapsulation sub-layer is disposed between the third thin film encapsulation sub-layer and the first thin film encapsulation sub-layer, and the fifth thin film encapsulation sub-layer is disposed between the fourth thin film encapsulation sub-layer and the first thin film encapsulation sub-layer.

9. The display panel of claim 1, comprising: a display region, wherein the display region comprises a first display region and a second display region, wherein the first display region is reused as a sensor reservation region and comprises a light-emitting region and a light-transmitting region, wherein the plurality of micro LEDs is disposed in the light-emitting region, and the plurality of organic light-emitting elements is disposed in the second display region.

10. The display panel of claim 9, wherein the first display region and the second display region are arranged along a first direction, and a boundary between the first display region and the second display region extends along a second direction, wherein the first direction intersects the second direction; or the boundary between the first display region and the second display region is U-shaped, and the first display region is partially surrounded by the second display region; or
the first display region comprises a first display sub-region and a second display sub-region, wherein the first display sub-region, the second display region and the second display sub-region are arranged in sequence along the first direction.

11. The display panel of claim 1, further comprising: a protective layer, wherein the protective layer is disposed on a side of the plurality of micro LEDs facing away from the organic light-emitting layer and covers the plurality of micro LEDs and the thin film encapsulation layer.

12. A manufacturing method of a display panel, comprising:
providing an array substrate;
forming an organic light-emitting layer on the array substrate, wherein the organic light-emitting layer comprises a plurality of organic light-emitting elements; and
forming a thin film encapsulation layer on the organic light-emitting layer, wherein the thin film encapsulation layer covers the organic light-emitting layer and comprises a plurality of thin film encapsulation sub-layers which are sequentially stacked;
wherein forming the thin film encapsulation layer on the organic light-emitting layer further comprises:
providing a plurality of micro light-emitting diodes (LEDs), and disposing the plurality of micro LEDs on at least one of the plurality of thin film encapsulation sub-layers; and
wherein forming the thin film encapsulation layer on the organic light-emitting layer further comprises:
forming a plurality of drive signal lines on at least one of the plurality of thin film encapsulation sub-layers, wherein the plurality of drive signal lines is electrically connected to the plurality of micro LEDs and configured to transmit drive signals to the plurality of micro LEDs;
wherein the plurality of thin film encapsulation sub-layers comprises a first thin film encapsulation sub-layer and a second thin film encapsulation sub-layer, the method further comprises:
forming the first thin film encapsulation sub-layer on the organic light-emitting layer; and forming the second thin film encapsulation sub-layer on the first thin film encapsulation sub-layer.

13. The manufacturing method of claim 12, wherein the plurality of micro LEDs is electrically connected to the plurality of drive signal lines in a bonding manner.

14. The manufacturing method of claim 12, wherein each of the plurality of drive signal lines comprises a first drive signal line and a second drive signal line, each of the plurality of micro LEDs comprises a first electrode and a second electrode, wherein the first drive signal line is electrically connected to first electrodes of corresponding micro LEDs of the plurality of micro LEDs, and the second drive signal line is electrically connected to second electrodes of corresponding micro LEDs of the plurality of micro LEDs; and
wherein forming the plurality of drive signal lines on the at least one of the plurality of thin film encapsulation sub-layers comprises:
forming the first drive signal line on the first thin film encapsulation sub-layer, wherein the second thin film encapsulation sub-layer covers the first thin film encapsulation sub-layer and the first drive signal line;

etching the second thin film encapsulation sub-layer to form a plurality of through holes on the second thin film encapsulation sub-layer; and forming the second drive signal line and a plurality of filling portions on the second thin film encapsulation sub-layer, wherein each of the plurality of filling portions is filled with a respective one of the plurality of through holes and in contact with a corresponding first drive signal line of first drive signal lines;

wherein the first drive signal line is electrically connected to the first electrodes of the corresponding micro LEDs of the plurality of micro LEDs through corresponding filling portions of the plurality of filling portions.

15. The manufacturing method of claim 14, wherein the plurality of thin film encapsulation sub-layers further comprises a third thin film encapsulation sub-layer, wherein the third thin film encapsulation sub-layer is an inorganic film; and wherein forming the first thin film encapsulation sub-layer on the organic light-emitting layer further comprises:

forming the third thin film encapsulation sub-layer on the organic light-emitting layer, wherein the third thin film encapsulation sub-layer is in contact with the organic light-emitting layer; and forming the first thin film encapsulation sub-layer on the third thin film encapsulation sub-layer.

16. The manufacturing method of claim 15, wherein the plurality of thin film encapsulation sub-layers further comprises a fourth thin film encapsulation sub-layer and a fifth thin film encapsulation sub-layer, wherein the fourth thin film encapsulation sub-layer is an organic film and the fifth thin film encapsulation sub-layer is the inorganic film; and wherein forming the first thin film encapsulation sub-layer on the third thin film encapsulation sub-layer further comprises:

forming the fourth thin film encapsulation sub-layer on the third thin film encapsulation sub-layer;

forming the fifth thin film encapsulation sub-layer on the fourth thin film encapsulation sub-layer; and forming the first thin film encapsulation sub-layer on the fifth thin film encapsulation sub-layer.

17. The manufacturing method of claim 12, wherein the plurality of thin film encapsulation sub-layers comprises at least one inorganic film and at least one organic film, wherein the at least one inorganic film is formed in a deposition manner, and the at least one organic film is formed in an ink-jet printing manner.

18. A display device, comprising a display panel, wherein the display panel, comprising:

an array substrate;

an organic light-emitting layer, wherein the organic light-emitting layer is disposed on a side of the array substrate and comprises a plurality of organic light-emitting elements;

a thin film encapsulation layer, wherein the thin film encapsulation layer is disposed on a side of the organic light-emitting layer facing away from the array substrate, covers the organic light-emitting layer, and comprises a plurality of thin film encapsulation sub-layers which are sequentially stacked;

a plurality of micro light-emitting diodes (LEDs), wherein the plurality of micro LEDs is disposed on a side of at least one of the plurality of thin film encapsulation sub-layers facing away from the organic light-emitting layer; and a plurality of drive signal lines, wherein the plurality of drive signal lines is electrically connected to the plurality of micro LEDs and configured to transmit drive signals to the plurality of micro LEDs, and the plurality of drive signal lines is disposed in contact with at least one of the plurality of thin film encapsulation sub-layers;

wherein the plurality of thin film encapsulation sub-layers comprises a first thin film encapsulation sub-layer and a second thin film encapsulation sub-layer, wherein the first thin film encapsulation sub-layer is disposed between the organic light-emitting layer and the second thin film encapsulation sub-layer.

\* \* \* \* \*